United States Patent [19]

Leland et al.

[11] 4,348,772

[45] Sep. 7, 1982

[54] FREQUENCY STABILIZATION CIRCUIT FOR A LOCAL OSCILLATOR

[75] Inventors: Kenneth W. Leland, Howell; Nelson R. Sollenberger, Ocean, both of N.J.

[73] Assignee: Bell Telephone Laboratories, Incorporated, Murray Hill, N.J.

[21] Appl. No.: 97,422

[22] Filed: Nov. 26, 1979

[51] Int. Cl.³ ............................................. H04B 1/16
[52] U.S. Cl. ................................. 455/260; 455/264; 455/164; 455/184; 329/122; 331/1 R; 331/18
[58] Field of Search ............... 455/258, 259, 260, 264, 455/265, 147, 164, 184, 182, 192, 196; 329/122, 123, 124; 331/1 R, 1 A, 10, 18, 19, 23, 34

[56] References Cited

U.S. PATENT DOCUMENTS

| | | | |
|---|---|---|---|
| 3,346,814 | 10/1967 | Haggai | 329/122 |
| 3,370,252 | 2/1968 | Zoerner | 331/18 |
| 3,922,609 | 11/1975 | Grohmann | 455/184 |
| 3,983,501 | 9/1976 | Lindstrum | 329/122 |
| 4,004,232 | 1/1977 | Amaya | 455/184 |
| 4,048,581 | 9/1977 | Lyberg | 331/1 A |
| 4,161,698 | 7/1979 | Klank | 455/192 |
| 4,175,254 | 11/1979 | Manfreda | 455/196 |

OTHER PUBLICATIONS

Low Noise Frequency Synthesizer Design For UHF Communication System, By E. Kather, pp. 7B-1 to 7B-5, IEEE Conference on Communications, 1974.

*Primary Examiner*—Tommy P. Chin
*Attorney, Agent, or Firm*—C. S. Phelan

[57] ABSTRACT

The numbers of cycles in a received signal including Doppler frequency spread are counted (36) modulo a base value much smaller than the number of cycles in such received signal during a predetermined measuring interval for thereby averaging out the effects of such frequency spread in the counter output. That output is utilized to control the frequency of a local oscillator (26) to lock it to the frequency of the received signals. The actual duration of the measuring interval is set (39) in accordance with a signal provided from the oscillator. Also shown are circuits (45, 23) for causing the oscillator initially to lock to a radio system master reference frequency and thereafter to lock, in a narrow frequency band, to a pilot frequency of a specified information channel.

14 Claims, 2 Drawing Figures

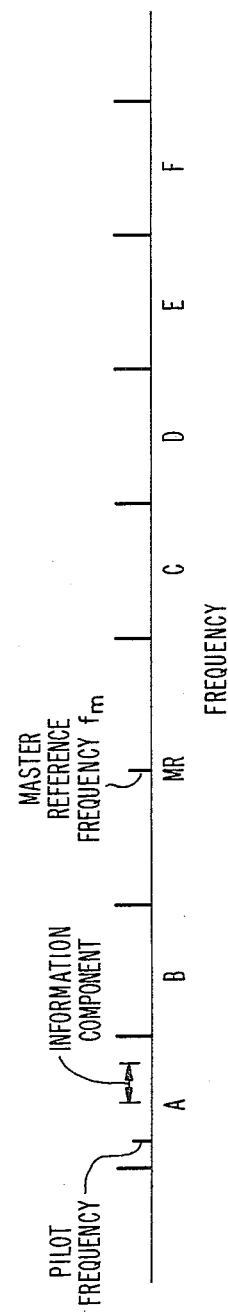

FREQUENCY STABILIZATION CIRCUIT FOR A LOCAL OSCILLATOR

BACKGROUND OF THE INVENTION

This invention relates to oscillator frequency stabilization circuits, and it relates more particularly to electric circuits of that type which are able to operate without the need for phase information in received signals with respect to which they are stabilized.

One factor commonly discouraging the usage of single sideband techniques in cellular mobile radiotelephone systems has been the difficulty of economically stabilizing oscillators at mobile radio stations to a predetermined frequency with sufficient precision to assure signal quality similar to that generally experienced in fixed station systems. The difficulty arises at least in part from the need to compensate for local oscillator drift as compared to a signal having a rapid frequency modulation, e.g., modulation due to Doppler frequency shift effects in a multipath radio signal transmission medium. Furthermore, the drift in frequency is partly due to component aging and partly due to more rapidly changing temperature conditions such as may occur when a vehicle with a mobile radio unit is initially started up on a cold day.

In land mobile radiotelephone systems, there are strong multipath effects. That is, at a given antenna, there are received simultaneously plural versions of a single message transmission propagated by way of various paths including different delays because of reflections from different topological features of the respective paths. Thus, the amount of net frequency shift due to Dopper effects at any instant of reception is unpredictable and varies rapidly in a frequency range which is as large as, for example, ±80 Hz for a mobile unit moving at 60 miles per hour and having its radio working in a frequency range above 800 mHz. Because of this unpredictability, the frequency modulation is sometimes called random frequency modulation or Doppler frequency spread, i.e., Doppler shift in a changing multipath environment. The term "Doppler spread" is generally utilized herein.

Fast acting phase locked loops track such fast random frequency variations instead of stripping them away. The Doppler spread must be removed to provide a stable time base for radio receiver operation. Other loops that operate more slowly have various faults such as not being conveniently useful with digital processing systems or providing an error signal that is inversely proportional to the frequency level at which the system works.

Frequency stabilization systems in the prior art generally are not concerned with land mobile radio communication problems and so do not deal with the fast-swinging frequency shifts which characterize the Doppler spread phenomenon. To the extent that the Doppler frequency shift effect is sometimes considered in signal receivers, it is in an environment which involves relatively uncomplicated and predictable shift effects. One example of prior art which considers Doppler shift without reference to the multipath problem is an A. L. Lindstrum, U.S. Pat. No. 3,983,501, wherein phase shift keyed signals are being transmitted in an undersea environment; and an adjustable bandwidth filter is included in a phase locked loop. Another reference is the T. F. Haggai, U.S. Pat. No. 3,346,814, in which a phase locked loop demodulator is included in a frequency stabilization path prior to the integrator of an automatic frequency control loop which provides an output for correcting a voltage controlled oscillator for low frequency drifts or variations. The corrections maintain the average carrier frequency centered in the passband of an input selectable-bandwidth filter bank but the demodulator loop oscillator can drift out of the passband of the filter.

Several frequency tracking loops use various digital counting algorithms which do not conveniently provide high stability in the environment of both fast and slow frequency changes. For example, the J. R. Zoerner, U.S. Pat. No. 3,370,252 and an L. Grohmann, U.S. Pat. No. 3,922,609, use a counter to generate a pulse after counting a certain number of received signal cycles and then they employ analog circuits to operate on the pulses to develop an analog error signal. In an A. B. Lyberg, U.S. Pat. No. 4,048,581, a digital error signal appears in a reversible counter, the output of which is utilized to control local oscillator frequency. However, that error signal resulted from using the counter to digitalize an analog error signal generated by other means not including the counter.

SUMMARY OF THE INVENTION

The present invention reduces the impact of the aforementioned received signal frequency modulation effects upon the control of a local oscillator frequency with respect to an input signal frequency component by counting amplitude transitions of the frequency modulated received signal and controlling the counting in response to an output of the local oscillator to average out the effects of such modulation in the counter output. That output is the digitally coded frequency error signal and is utilized to control the local oscillator frequency.

BRIEF DESCRIPTION OF THE DRAWING

A more complete understanding of the invention and the various features, objects, and advantages thereof may be obtained from a consideration of the following detailed description in connection with the appended claims and the attached drawings in which:

FIG. 2 is a frequency spectrum diagram for facilitating the explanation of the invention.

DETAILED DESCRIPTION

Figure 1:
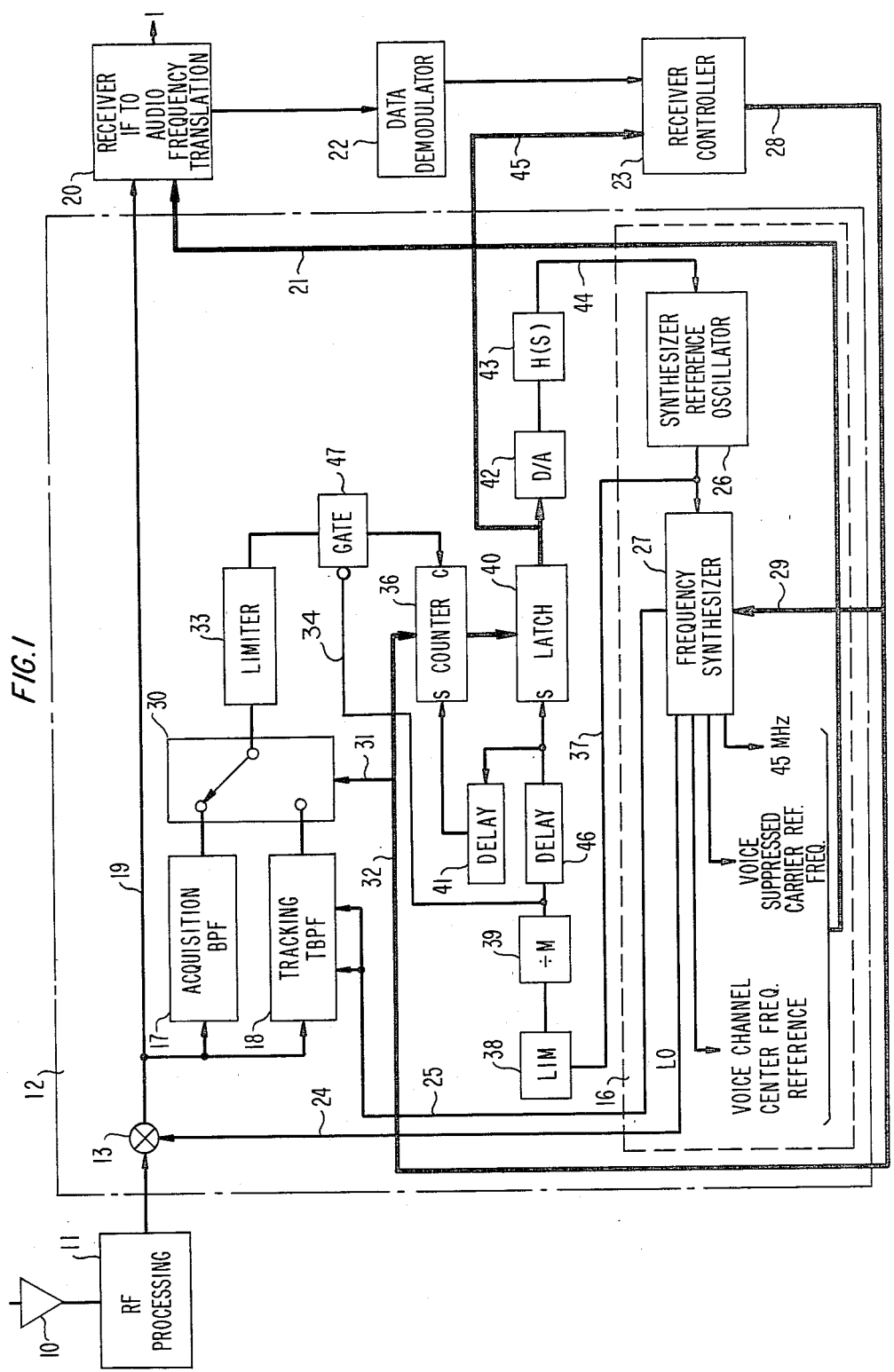
FIG. 1 is a simplified block and line diagram of a radio receiving system utilizing the invention.

In FIG. 1 the invention is illustrated, without limitation, in a single sideband radio receiver for a mobile radiotelephone system. Such an application is one of the more difficult frequency stabilization results to achieve, and lack of a relatively inexpensive solution has long been a stumbling block in the single sideband radio field.

It is assumed that in the system of FIG. 1 there is broadcast from a fixed station (not shown) a master reference frequency to which information channel frequencies transmitted from the same or other fixed stations are locked at least in frequency. For the convenience of the reader, FIG. 2 is a simplified spectrum diagram at an arbitrary frequency level in the total frequency spectrum. FIG. 2 shows a master reference frequency $f_m$ in a master channel MR and plural information frequency channels A through F which are adjacent to one another or to the reference channel MR. Each information channel includes an information component band and a pilot frequency in a total channel of, e.g., 5 kHz bandwidth. In one embodiment, specifically indicated in FIG. 2 with respect to only channel A, a pilot frequency appears at 500 Hz above the lower (left as illustrated) edge of the channel, and the information band appears between 800 and 3500 Hz above the same channel edge.

Note that the master reference frequency, $f_m$, is in a channel which is about twice the bandwidth of the regular information channel, i.e., about 10 kHz in MR; and the master reference frequency is approximately centered in that wide channel to allow ample free spectrum space for a newly activated mobile unit to search for, find, and lock to the master reference frequency. With this arrangement, a mobile unit reference frequency oscillator of conventional accuracy, e.g., 2 parts per million, with a maximum short-term drift stability on the order of 50 Hz over a period of 10 seconds at 900 mHz can be controlled in accordance with the invention to a much greater accuracy, e.g., one part per hundred million. Reference oscillators with the mentioned conventional capabilities are readily commercially available; and, for example, the Erie Company 20 to 1165 oscillator chip is within that capability range.

Returning now to a consideration of FIG. 1, radio frequency signals received at an antenna 10 include signals for a plurality of communication channels in the radio system as well as including deep Rayleigh fading and the rapidly swinging Doppler frequency spread already noted. A radio frequency processing circuit 11 includes such functions as band limiting, gain control, and the like. The output of the processing circuit 11 is applied to a frequency stabilization circuit 12 at one input to a balanced mixer 13. That mixer is referenced by a local oscillator circuit 16 (to be described) for translating the radio frequency signals to a predetermined intermediate frequency (IF) band which is advantageously centered on a predetermined nominal intermediate frequency. The nominal IF is advantageously a common frequency for all channels of the system. Thus, the local oscillator 16 output signal is initially selected, in the case of the master reference, to place the nominal master reference frequency at a predetermined intermediate frequency such as 45 mHz. Of course, a wide range of other mixer 13 output products are present at IF for undesired channels.

All intermediate frequency signals from mixer 13 are applied in parallel to at least two bandpass filters with different bandwidths. These are the filters 17 and 18. Those signals are further applied by way of a lead 19 for utilization in a receiver section 20 which also utilizes certain outputs of the frequency stabilization circuit 12 to convert the IF to audio. The latter outputs of circuit 12 are applied by way of a multicircuit bus 21 to control the receiver frequency translations for recovering information, e.g., voice or data, from a selected incoming channel. One illustrative signal sideband receiver which advantageously can utilize such plural stabilization circuit outputs for this purpose is the "Single Sideband Receiver with Feed Forward Phase and Gain Corrections" in the U.S. patent application Ser. No. 65,957, filed Aug. 13, 1979, of K. W. Leland and which is copending with, and is assigned to the same assignee as, the present application.

A data demodulator 22 receives baseband signals from an appropriate portion of the receiver section 20 depending upon whether the data had been transmitted within the information band or outside that band as is well known in the art. Demodulator 22 detects data synchronization bit patterns to initiate demodulation of the data for application to a receiver controller 23. That controller is advantageously a microprocessor based controller for many mobile radio unit transceiver functions as is well known in the art. Here the controller 23 is considered only in regard to aspects relating to the control of the frequency stabilization circuit 12 for the overall receiver of FIG. 1.

The local oscillator 16 in the stabilization circuit 12 includes a synthesizer reference oscillator 26 which is to be controlled in frequency by the stabilization circuit. Also included is a frequency synthesizer 27 which advantageously includes at least one frequency synthesizer chip such as, e.g., the synthesizer of the C. W. Schaible, U.S. Pat. No. 3,921,094. The Schaible synthesizer includes a voltage controlled oscillator in a phase locked loop which is to be driven by an external oscillator, and the loop has frequency division circuits of input-data-directable division ratio. In the illustrative embodiment, the controller 23 is coupled to different components of the receiver by way of a multiconductor data and control bus 28. A branch 29 from that bus is coupled to the frequency synthesizer 27 for supplying frequency division ratio control commands for any frequency synthesizer chips included therein. Synthesizer outputs are typically lower in frequency than the oscillator 26 frequency but are not necessarily integrally harmonically related to that frequency.

One output of the frequency synthesizer 27 appears on a local oscillator lead 24, otherwise designated LO, and is used to determine the input channel to be selected by referencing the mixer 13 to put the center frequency of the desired channel within the passband of filter 17. The filter 17 is an acquisition bandpass filter; and in order to allow for some frequency error, it has a passband which is broad enough to pass 5 kHz of the master reference channel MR for a newly activated mobile unit transceiver but not broad enough to pass substantial energy from adjacent information channels given a local reference oscillator stability of ±2 ppm. That is, the maximum anticipated range of difference frequency magnitudes is about ±2 kHz, and thus, the MR signal will be within the 5 kHz bandwidth of the filter centered on the nominal IF which here has been assumed to be 45 mHz.

The filter 18 is a tracking bandpass filter and has a passband which is narrow enough to pass primarily only the desired nominal IF frequency with any accompanying random frequency shift, such as Doppler spread, which may be associated with that frequency. Thus, the filter 18 is advantageously arranged in the illustrative embodiment to have a pass bandwidth of 200 Hz, i.e., a band which contains the Doppler spread band of ±80 Hz for a mobile unit operating at about 60 miles per hour on a channel which is at a frequency in the microwave mobile radio band above 800 mHz. Filter 18 is advantageously implemented by a translating bandpass filter (TBPF) of the type described in the aforementioned Leland application and utilizing a common input and output reference frequency supplied by way of a lead 25 from the synthesizer 27. This filter is tunable across the 5 kHz channel at 45 mHz by the lead 25 signal according to the position of the pilot component within its particular channel. Likewise the spectral position of the filter 18 passband tracks corrections in the tuning of oscillator 26.

An electrically controllable selector switch 30 is provided for selecting the output of one of the multiple bandpass filters according to control signals provided by a lead 31 extending from a further branch 32 of the data and control bus 28. That branch 32 also provides preset data to a counter as will be described.

A limiter 33 couples the output from switch 30 to a gate 47 which applies these pulses to a counting input of a binary counter 36 at times determined in a manner which will be described. The limiter includes circuits for applying a predetermined limited amount of gain followed by clipping circuits so that the leading and trailing edges of signals received at the IF level are sharpened for ease of actuation of following logic such as the gate 47. The counter 36 counts the received signal transitions extending in a predetermined direction, e.g., positive-going signal transitions, in the received, limited signals during a measuring interval. Preset data is loaded into the counter from branch 32 of the bus from receiver controller 23, and that data is periodically sampled into the counter 36 by a strobe signal which enables the counter, bit-parallel, presetting, input connections.

The aforementioned strobe signal occurs at a low rate with respect to the received IF rate, and in one embodiment the strobe signal rate was advantageously once per second. This strobe signal is provided by tapping the output of the reference oscillator 26 by a lead 37 which applies the signal through a limiter 38 and a frequency divider 39. Limiter 38 is provided to sharpen the edges of the oscillator pulses. Frequency divider 39 divides the oscillator output by a factor M which is the factor necessary to obtain the illustrative pulse rate of once per second from the oscillator output. Each pulse from divider 39 is advantageously about 200 nanoseconds long.

The strobe pulses provided by the divider 39 are utilized, by way of a lead 34, to disable gate 47 for an interval sufficient to allow counter 36 to stabilize. In addition, the strobe signal is coupled through a delay circuit 46 of about 100 nanoseconds to allow the counter to stabilize before its contents are strobed into latch 40. The strobe signal from delay circuit 46 is further delayed about 100 nanoseconds in a delay circuit 41, to allow the data to settle in latch 40, before being applied to strobe preset data into counter 36 for a new count measuring interval. Latch 40 is advantageously edge triggered.

The purpose of the counter 36 is to operate with respect to a predetermined modulus as a modulo counter to average the frequency error between the nominal IF signals actually received from the limiter 33 and the desired nominal value of the IF that should be produced when local oscillator 16 is on frequency. To this end the counter operates with respect to a modulus, or base value, which is much smaller than the incoming signal frequency. That is, the counter has a size which is much less than that needed to count the number of IF signal cycles in the measuring, or strobing, interval. The counter size is also somewhat greater than the number of IF cycles in the maximum average error, or difference, frequency magnitude which can be passed by the acquisition bandpass filter 17. That is, in the indicated illustrative implementation of a 5 kHz bandwidth for filter 17, the counter capacity is greater than 5,000. The counter 36 must have sufficient stages to provide the desired resolution of the frequency error indication for smooth control of the oscillator 26. To meet these various requirements, it has been found that a 14-bit counter, i.e., one operating modulo 16,384, serves well in the illustrative embodiment.

The preset data has a predetermined value in the range of counter 36 such that when the reference oscillator 26 is operating at the correct frequency the counter will, after a measuring interval, be at a predetermined intermediate count level. That level is the half-of-full-count level in one embodiment in which a digital-to-analog conversion is accomplished over all counter bits to produce an analog form of the error signal. In that embodiment, using a 45 mHz signal from mixer 13 and a one-second measuring interval, a preset data word 10 1010 1100 0000 yields a mid-range zero-error value at the end of the interval. With these requirements, it is apparent that the counter 36 is large enough so that an oscillator 26, with the drift stabilization characteristic already mentioned of an approximate maximum drift of only 50 Hz in 10 seconds, cannot possibly drift through enough cycles in the one-second measuring interval to run out of counter range in either direction from the preset value and thereby render the counter indication ambiguous.

Clearly, the counter 36 will recycle many times with such a large difference, i.e., about 3 orders of magnitude in the illustrative embodiment, between the frequency of its input counting drive from limiter 33 (at approximately 45 mHz) and its fourteen-stage counting capacity (of 16.384 kHz). If the oscillator 26 frequency is low with respect to the nominal IF frequency, the measuring interval will be longer than the desired one second; and the counter 36 will necessarily operate beyond the desired half-of-full-count level to a value that is indicative of the error in the frequency of the oscillator 26. On the other hand, if the oscillator 26 frequency is high, the measuring interval will be shorter than the desired one second interval; and counter 36 will show a value at the end of such an interval which is smaller than the desired half-of-full-count value. It has been found that the frequency spread variations of Doppler spread usually average out in the course of such a measuring interval of one second within about five hertz, and the oscillator 26 is then locked to the nominal IF value of 45 mHz for the illustrative implementation.

The samples of counter 36 content which are applied to latch 40 at the ends of the successive measuring intervals are continuously applied in turn in bit parallel to a digital to analog converter 42. That converter is advantageously of the same bit number span as are the counter 36 and latch 40 for fastest loop acquisition of the IF. However, it has been found that the frequency stabilization circuit 12 is still adequately operable if a smaller bit span is utilized in the digital to analog converter 42 to reduce significantly the cost of the converter at the expense of a larger acquisition time. For example, a converter span of eight bits working from the eight least significant bits of latch 40 will work well with the addition of simple logic to be described.

An integrator 43 and lead 44 apply the output of digital to analog converter 42 to the frequency control input of reference oscillator 26 for controlling that oscillator. Any suitable commercially available integrating circuit may be employed for the circuit 43 and includes negative bias (not separately shown) so that the mid-range value of converter 42 output will produce a zero-error output from circuit 43. That circuit ramps the analog values with a time constant which is sufficiently large to smooth out discrete analog steps in the converter 42 output and which appear at the sample rate for the latch circuit 40. This time constant must also be long enough to prevent overcorrection between measurement samples which could lead to loop instability. Otherwise, the time constant for the integration must be small enough to allow fast acquisition and fast loop response. Output from the integrator controls the frequency of oscillator 26 in a direction to offset the error indicated by the output of converter 42 in a manner already described.

It was previously mentioned that converter 42 could be of smaller bit size than the counter 36 if additional logic is provided. For that case, the integrator 43 internal bias is selected so that the integrator output is a zero-error indication for the D/A converter mid-range value. Similarly the counter preset data value supplied from controller 23 must be modified so that the zero-error count level in counter 36 will be at the converter 42 mid-range value. Consequently maximum resolution is retained about the zero-error condition within the converter range, and maximum error is indicated outside the converter range. This arrangement still makes some use of the full counter range but in a slightly different way. That is, instead of integrator circuit bias causing the low and high parts of the counter range to be negative and positive error indications on either side of the counter mid-range value, the utilization is shifted so that the negative and positive error indications are on either side of the converter mid-range value. In addition, a first portion of the negative error indication range lies in the high part of the counter range above the counter mid-range value; and a second portion lies in the low part of the counter range below the converter mid-range value.

The logic to facilitate the foregoing arrangement, for example, selects one of three possible sets of input connections for the converter 42 depending upon the count magnitudes in counter 36; and that logic is here outlined in terms of the previously cited example of an eight-bit converter used with a fourteen-bit counter. For counter values within the range of the converter, the counter least significant eight bit outputs are coupled to the respective inputs of the converter as long as there are no ONES in the counter bit positions 9-14. For counter values above the converter range but no greater than the counter mid-range value (a binary ONE in any of the counter bit positions 9-13 and a binary ZERO in the most significant bit position 14), all converter inputs are forced to the binary ONE (maximum positive error) state. For counter values above the counter mid-range value (a binary ONE in position 14), all converter inputs are forced to the binary ZERO (maximum negative error) state.

Frequency error magnitude information in latch 40 is expressed in binary coded form and is thus conveniently available for processing and control in various ways. For example, a multiconductor circuit 45 couples the latch 40 outputs in bit parallel to the receiver controller 23 for use in determining when the receiver should be switched from bandpass filter 17 to bandpass filter 18 following acquisition of the lock-up state on the master reference frequency. This is done by comparing the data in latch 40 with the bounds of a threshold range of values stored in the controller. The range size represents a small part of the bandwidth of filter 18, e.g., ±20 hertz for the illustrative 200 Hz bandwidth filter 18. This makes it certain that the signal is within the filter 18 passband before switching to that filter. If the data value is within the threshold range for a predetermined interval, e.g., about 3 measuring intervals, it is assumed that acquisition, i.e., lock-up, has occurred; and an order is issued to switch the filters.

Thereafter, while operating on the filter 18, the program of controller 23 is enabled to direct the synthesizer 27 to retune to a predetermined information channel dedicated to paging and access functions on which data signals are received to direct further retuning to, e.g., an information channel for voice communication. For each retuning, the synthesizer output LO on lead 24 is at a frequency to bring the new channel's center frequency at the output of mixer 13 to 45 mHz, and filter 18 is tuned to the appropriate pilot position within the 5 kz channel by the signal on line 25 from synthesizer 27. Similarly, the preset data on bus 32 to counter 36 is modified by controller 23 to reflect that particular pilot position.

The stabilization circuit 12 is automatically switched back to the bandpass filter 17 upon the occurrence of any new initiation of mobile unit power up or if some unexpected system fault should cause, for example, loss of signal is evidenced by a low automatic gain control signal to controller 23 from other receiver circuits (not shown).

In summary is is apparent that the stabilization circuit 12 employs commercially available circuit elements which do not require critical adjustments or special temperature control ovens to maintain local oscillator frequency stabilization with orders of magnitude greater precision in the face of received frequency spread than the oscillator alone is capable of.

Although the present system has been described in connection with particular embodiments thereof, it is to be understood that additional embodiments, applications, and modifications which will be obvious to those skilled in the art are included within the spirit and scope of the invention.

We claim:
1. In a frequency stabilization circuit in which the offset between a prdetermined frequency and a received signal frequency related to an output of a local oscillator includes a slowly changing local oscillator drift component and a rapidly changing received signal frequency modulation component, the improvement comprising means for counting (36) cycles in said received signal frequency, means, responsive to an output of said local oscillator, for controlling (38, 39, 46, 41) said counting means to produce therefrom a control signal having a magnitude representing the average of said offset over a time interval which is defined by an output of said local oscillator, and means for applying (40, 42, 43) said control signal to control the frequency of said local oscillator.

2. The frequency stabilization circuit in accordance with claim 1 in which said controlling means comprises means for counting down (39) an output frequency of sald local oscillator to a frequency level much lower than the frequency of said received signals, means for supplying (32) predetermined preset data to said counting means, means, responsive to said lower frequency, for strobing (41) said preset data into said counter.

3. The frequency stabilization circuit in accordance with claim 1 in which said counting means comprises a counter (36) for counting modulo a base value which is much less than the number of cycles of said received signal frequency which can occur during said time interval.

4. The frequency stabilization circuit in accordance with claim 1 in which
means are provided for modifying said received signal frequency, and
said local oscillator comprises
a reference oscillator (26) having an output for providing said local oscillator output,
frequency synthesizing means (27) driven by said reference oscillator and having an input for receiving data signals directing synthesizing means production of at least one output at a frequency lower than the frequency of the output of said reference oscillator, and
means for applying (24) said one lower frequency output signal to said modifying means.

5. The frequency stabilization circuit in accordance with claim 4 in which there are provided
means, responsive to said received signals, for providing (22, 23, 28, 29) said data signals to control said synthesizing means.

6. In a frequency stabilization circuit for controlling the frequency of a local oscillator (16) to have a predetermined frequency relationship with respect to a received radio signal, the improvement comprising
means for translating (13) the received radio signal to a predetermined intermediate frequency range by mixing the received signal with a first output of said local oscillator that nominally differs from a predetermined received channel frequency by the amount of said intermediate frequency,
means, responsive to a second output of said local oscillator, for producing (36) a binary coded character signal representation of the average difference frequency between a predetermined nominal intermediate frequency in said range and a component of similar frequency in the output of said translating means, and
means, responsive to said binary coded character signal representation, for controlling (42, 43) the frequency of said local oscillator to reduce said average difference frequency.

7. The frequency stabilization circuit in accordance with claim 6 in which said producing means comprises
means for counting (36) modulo a predetermined integer, said integer being similar in magnitude to and larger than the maximum anticipated magnitude of said average difference frequency,
means for counting down (39) said second output of said local oscillator to a signal having a pulse repetition period for defining a predetermined frequency measuring interval which is much larger than an interval required for said counting means to count from zero to full count,
means for applying (17, 18, 33) said translating means output to a counting input of said modulo counting means,
means, responsive to the output of said modulo counting means, for controlling (42, 43) the frequency of said local oscillator, and
means, responsive to said down counting means, for periodically presetting (41) said modulo counting means to a value which allows said modulo counting means to attain a predetermined final count level by the end of said measuring interval when said local oscillator is at a frequency such that said nominal and similar frequencies are substantially the same.

8. The frequency stabilization circuit in accordance with claim 6 in which said producing means comprises
means for bandpass filtering (17, 18) the output of said translating means at a center frequency approximately equal to said similar frequency.

9. The frequency stabilization circuit in accordance with claim 8 in which said bandpass filtering means comprises
a first bandpass filter (17) having said center frequency and having a pass bandwidth at least as large as a maximum anticipated range of magnitudes of a difference frequency between said nominal intermediate frequency and said similar frequency for acquisition of local oscillator lock to said similar frequency,
a second bandpass filter (18) having an adjustable center frequency withing the passband of said first bandpass filter and having a pass bandwidth which is much smaller than said first filter bandwidth for frequency tracking operation after said local oscillator lock.

10. The frequency stabilization circuit in accordance with claim 6 in which said controlling means comprises
means for integrating (43) said difference frequency representation of said producing means, and
means for controlling (44) the frequency of said local oscillator in response to the output of said integrating means.

11. The frequency stabilization circuit in accordance with claim 6 in which a predetermined range of values for said signal representation indicates acquisition of said component of similar frequency and there are provided
first means for selecting (17) from an output of said translating means a band of frequencies including said component of similar frequency,
second means for selecting (18) from an output of said translating means a band of frequencies much smaller than the aforementioned band including said component of similar frequency,
means for applying (30, 33) said first selecting means output to said producing means, and
means, responsive to said predetermined range of values for said signal representation, for switching (23, 30) said applying means from the output of said first selecting means to the output of said second selecting means.

12. The frequency stabilization circuit in accordance with claim 11 in which said switching means further comprises
means, responsive to detection of said signal representation outside of said predetermined range for switching said applying means from the output of said second selecting means to the output of said first selecting means.

13. The frequency stabilization circuit in accordance with claim 6 in which said local oscillator comprises
a reference oscillator (26),
frequency synthesizing means (27) driven by said reference oscillator and having an input for receiving signals directing synthesizing means production of at least one output signal of frequency lower than the frequency of the output of said reference oscillator, and means for applying (24) said one lower frequency output signal as a reference frequency signal to said translating means.

14. In a circuit for stabilizing the frequency of a local oscillator with respect to the frequency of an incoming signal including irregular frequency modulation, the improvement comprising means for counting the incoming signal frequency with respect to a modulus which is much smaller than and independent of the incoming signal frequency, means, responsive to an output of said local oscillator, for sampling the counting means contents at substantially periodically recurring times, the period of recurrence being sufficiently long to allow the counting means to recycle a sufficient plurality of times in a period to average out said irregular frequency modulation, means for presetting said counting means at the start of each sampling period to a predetermined value, and means, responsive to an output of said sampling means, for adjusting the frequency of said local oscillator.

* * * * *

UNITED STATES PATENT AND TRADEMARK OFFICE
CERTIFICATE OF CORRECTION

PATENT NO. : 4,348,772

DATED : September 7, 1982

INVENTOR(S) : Kenneth W. Leland and Nelson R. Sollenberger

It is certified that error appears in the above—identified patent and that said Letters Patent is hereby corrected as shown below:

Column 3, lines 22 and 23, "20 to 1165" should read --20TO1165--
Column 8, line 40, "prdetermined" should read --predetermined--
line 59, "sald" should read --said--.

Signed and Sealed this

First Day of March 1983

[SEAL]

Attest:

GERALD J. MOSSINGHOFF

Attesting Officer

Commissioner of Patents and Trademarks